(12) United States Patent
Jo et al.

(10) Patent No.: US 12,720,814 B2
(45) Date of Patent: Aug. 25, 2026

(54) FAST RECOVERY DIODE AND METHOD FOR MANUFACTURING THE SAME

(71) Applicant: Magnachip Semiconductor, Ltd., Cheongju-si (KR)

(72) Inventors: Young Seo Jo, Seoul (KR); Ho Hyun Kim, Seoul (KR); Ji Yong Lim, Seoul (KR); Chan Ho Park, Seoul (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 356 days.

(21) Appl. No.: 18/535,464

(22) Filed: Dec. 11, 2023

(65) Prior Publication Data

US 2024/0304664 A1 Sep. 12, 2024

(30) Foreign Application Priority Data

Mar. 7, 2023 (KR) ........................ 10-2023-0029811

(51) Int. Cl.
*H10D 62/10* (2025.01)
*H10D 8/00* (2025.01)
*H10D 8/01* (2025.01)
*H10P 14/20* (2026.01)

(52) U.S. Cl.
CPC ........... *H10D 62/106* (2025.01); *H10D 8/045* (2025.01); *H10D 8/411* (2025.01); *H10P 14/3822* (2026.01)

(58) Field of Classification Search
CPC .... H10D 62/106; H10D 62/105; H10D 8/045; H10D 8/411; H10D 62/60
See application file for complete search history.

(56) References Cited

U.S. PATENT DOCUMENTS 6,881,638 B1 * 4/2005 Gau ........................ H10D 10/40 257/E29.183
10,290,631 B2 * 5/2019 Moen .................. H10D 84/401
2005/0101098 A1 * 5/2005 Gau ..................... H10D 84/813 257/E21.364
2011/0018005 A1 * 1/2011 Nakano .................. H10D 8/051 257/329
2011/0024791 A1 * 2/2011 Schulze ................... H10D 8/00 257/107
2012/0326266 A1 * 12/2012 Pu ........................ H10D 89/611 257/506
2013/0175608 A1 * 7/2013 Lee ........................ H10D 30/66 257/329
2013/0193508 A1 * 8/2013 Lee ........................ H10D 30/66 257/329

(Continued)

*Primary Examiner* — Bac H Au
(74) *Attorney, Agent, or Firm* — NSIP Law

(57) ABSTRACT

A fast recovery diode includes a substrate; an epitaxial layer formed on the substrate; a P-type low-concentration doping region formed in an upper portion of the epitaxial layer and a P-type high-concentration doping region formed on the P-type low-concentration doping region; a P-type guard ring formed in the upper portion of the epitaxial layer to surround the P-type low-concentration doping region and P-type high-concentration doping region; a field oxide layer formed on the P-type guard ring and the P-type high-concentration doping region; an anode electrode formed to overlap the P-type high-concentration doping region and a portion of the field oxide layer; and a cathode electrode formed below the substrate.

11 Claims, 8 Drawing Sheets

(56) References Cited

U.S. PATENT DOCUMENTS

| | | | | |
|---|---|---|---|---|
| 2014/0342517 | A1* | 11/2014 | Lin | H10D 30/0297 438/270 |
| 2015/0028350 | A1* | 1/2015 | Suvorov | H10D 62/8325 257/77 |
| 2015/0115390 | A1* | 4/2015 | Kim | H10D 89/611 257/487 |
| 2017/0243937 | A1* | 8/2017 | Ward | H10D 62/106 |
| 2018/0197781 | A1* | 7/2018 | Chevalier | H10D 84/0121 |
| 2024/0105844 | A1* | 3/2024 | Lin | H10D 30/601 |

* cited by examiner

FAST RECOVERY DIODE AND METHOD FOR MANUFACTURING THE SAME

CROSS-REFERENCE TO RELATED APPLICATIONS

This application claims the benefit under 35 U.S.C. 119 (a) of Korean Patent Application No. 10-2023-0029811 filed on Mar. 7, 2023 in the Korean Intellectual Property Office, the entire disclosure of which is incorporated herein by reference for all purposes.

BACKGROUND

1. Field

The following description relates to a fast recovery diode and a method for manufacturing the same.

2. Description of Related Art

As fast recovery diodes (FRDs) have excellent high-speed switching characteristics compared to typical PN diodes, fast recovery diodes are widely used as switching or rectification devices in power semiconductor devices that require fast switching, such as insulated gate bipolar mode transistors (IGBTs), metal-oxide-semiconductor field-effect transistors (Power MOSFETs), and power semiconductor devices that require high breakdown voltages.

Fast recovery diodes are typically fabricated by performing a high concentration ion implantation process to form a P-type high concentration doping region (P-well) near the anode. Given the significant number of hole carriers implanted, these diodes require a process that enables electrons and hole carriers to recombine while maintaining a proper turn-on switching energy (Eon), reverse recovery time (Trr), and maximum reverse recovery current (Irrm).

In short, fast recovery diodes enhance hole carrier recombination via high absorbed dose during e-beam irradiation and high concentration helium implantation during helium irradiation, ultimately decreasing the hole carriers' life time and resulting in a short reverse recovery time (Trr).

However, due to the high absorbed dose during the electron beam (e-beam) irradiation process, a large number of crystal defects are generated in a substrate and an epitaxial layer of the fast recovery diode, and additional defects are generated in a specific epitaxial layer by implanting high-concentration helium.

As a result, fast recovery diodes have a noticeable drawback wherein a large field is formed near the PN junction when a high reverse voltage is applied. In addition, reverse recovery operation at high temperatures may cause leakage current to increase, resulting in power loss that restricts the area of guaranteed reliability (e.g., temperature range).

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a fast recovery diode includes: a substrate; an epitaxial layer formed on the substrate; a P-type low-concentration doping region formed in an upper portion of the epitaxial layer and a P-type high-concentration doping region formed on the P-type low-concentration doping region; a P-type guard ring formed in the upper portion of the epitaxial layer to surround the P-type low-concentration doping region and the P-type high-concentration doping region; a field oxide layer formed on the P-type guard ring and the P-type high-concentration doping region; an anode electrode formed to overlap the P-type high-concentration doping region and a portion of the field oxide layer; and a cathode electrode formed below the substrate.

The substrate may be a high-concentration N-type (N+) substrate.

The epitaxial layer may include an N-type low-concentration buffer layer; and an N-type low-concentration drift layer formed on the N-type low-concentration buffer layer.

The fast recovery diode may further include a passivation layer formed on top of the anode electrode.

A bottom surface of the P-type low-concentration doping region may be located lower than a bottom surface of the P-type guard ring relative to a top surface of the epitaxial layer.

A bottom surface of the field oxide layer may be in contact with the P-type guard ring, the epitaxial layer, and the P-type high-concentration doping region.

The field oxide layer may overlap the P-type low-concentration doping region.

The P-type high-concentration doping region may be in ohmic contact with the anode electrode.

A concentration ratio between the P-type low-concentration doping region and the P-type high-concentration doping region may range from 1:10 to 1:100.

The fast recovery diode of may further include a helium irradiation defect layer formed in the epitaxial layer. The helium irradiation defect layer may be disposed below the P-type low-concentration doping region. The helium irradiation defect layer may be located between 15 um and 30 um beneath a top surface of the epitaxial layer.

The helium irradiation defect layer may include helium inside.

In another general aspect, a method for manufacturing a fast recovery diode includes: forming an epitaxial layer on a substrate; forming a P-type guard ring by implanting P-type ions into a portion of the epitaxial layer; forming a field oxide layer on the P-type guard ring; forming a P-type low-concentration doping region within the epitaxial layer; forming a P-type high-concentration doping region on the P-type low-concentration doping region; forming an anode electrode to overlap the P-type high-concentration doping region and a portion of the field oxide layer; performing electron beam irradiation after forming the anode electrode; performing helium irradiation after performing the electron beam irradiation; and forming a cathode electrode below the substrate.

The method may further include forming a passivation layer to cover a portion of top surfaces of the anode electrode and the field oxide layer.

The formation of the epitaxial layer may include forming a buffer layer on the substrate; and forming a drift layer on the buffer layer.

The formation of the P-type low-concentration doping region may include implanting P-type low-concentration ions into the epitaxial layer; and performing a first annealing process at a temperature between 900° C. and 1300° C. The P-type low-concentration ions may include boron (B).

The formation of the P-type high-concentration doping region may include implanting P-type high-concentration ions into the P-type low-concentration doping region; and performing a second annealing process at a temperature between 700° C. and 900° C. The P-type high-concentration ions may comprise boron (B) ions including fluorine (F).

A bottom surface of P-type low-concentration doping region may be located lower than a bottom surface of the P-type guard ring relative to a top surface of the epitaxial layer.

The P-type high-concentration doping region may be formed to diffuse to one side of a lower part of the field oxide layer.

A concentration ratio between the P-type low-concentration doping region and the P-type high-concentration doping region may range from 1:2 to 1:20.

The boron ions including fluorine may include boron fluoride (BF2).

The drift layer may include a defect layer generated by the helium irradiation and formed within the drift layer below the P-type low-concentration doping region.

Figure 1:
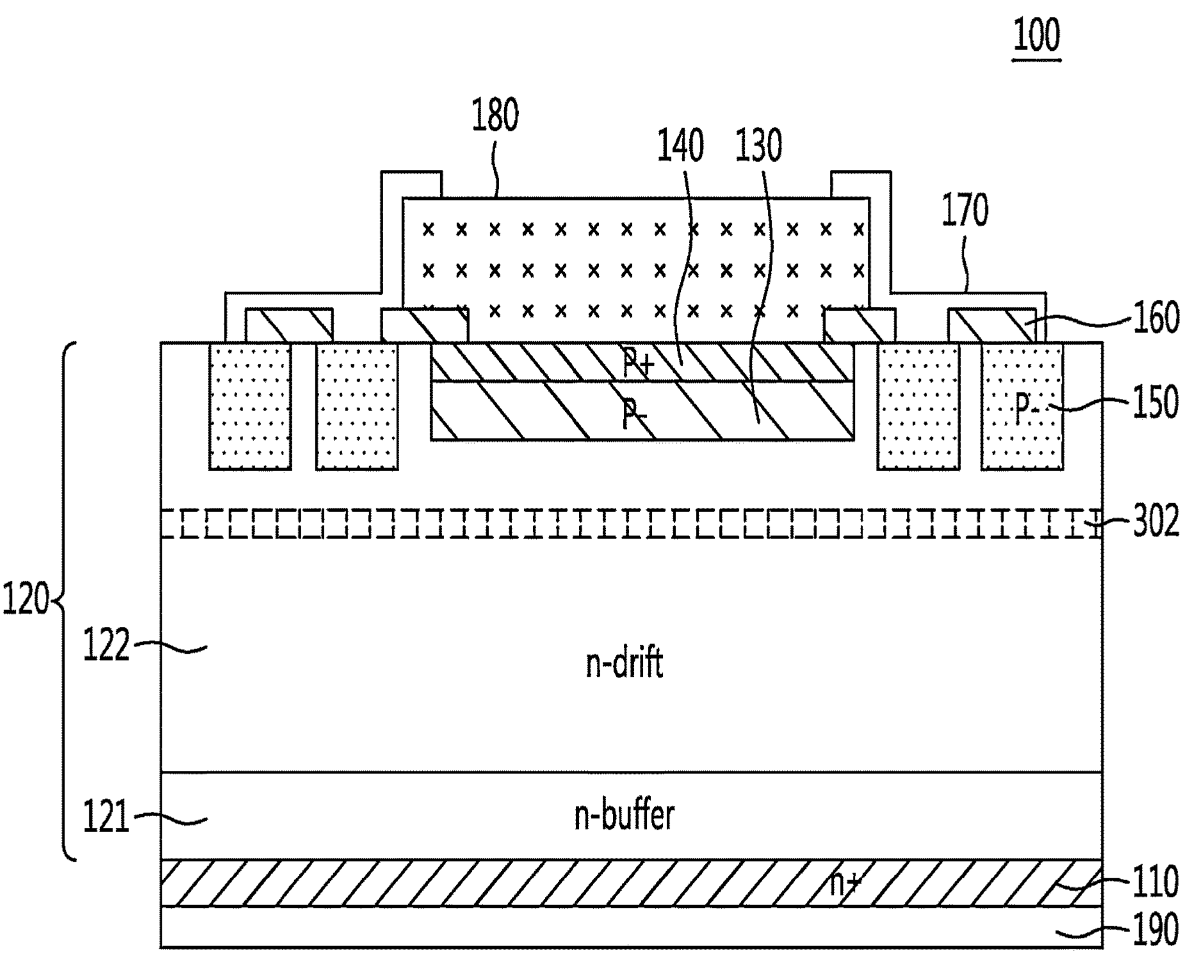
FIG. 1 illustrates a sectional view of a fast recovery diode according to an example of the present disclosure.

Other features and aspects will be apparent from the following detailed description, the drawings, and the claims.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

Although terms such as “first,” “second,” and “third” may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles “a,” “an,” and “the” are intended to include the plural forms as well, unless the context clearly indicates otherwise. The terms “comprises,” “includes,” and “has” specify the presence of stated features, numbers, operations, members, elements, and/or combinations thereof, but do not preclude the presence or addition of one or more other features, numbers, operations, members, elements, and/or combinations thereof.

An expression representing a part of the terms such as “part” or “portion” used in the present disclosure may be used herein to describe a device that may include a specific function, software that may include a specific function, or a combination of devices and software that may include a specific function, and is not to be used to limit the described function. This is provided to help a more general understanding of the present disclosure, and various modifications and variations may be made from these descriptions by those of ordinary skill in the field to which the present disclosure belongs.

Additionally, it should be noted that all electric signals used in the present disclosure, as an example, may be reversed in signs of all electric signals to be described below when an inverter or the like is additionally provided in the circuit of the present disclosure. Therefore, the scope of the claims of the present disclosure is not limited to the direction of the signal.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, the present disclosure is described in more detail based on the example illustrated in the drawings.

FIG. 1 illustrates a sectional view of a fast recovery diode according to an example of the present disclosure.

Referring to FIG. 1, a fast recovery diode 100 according to an example of the present disclosure may include: a substrate 110, an epitaxial layer 120 formed on the substrate 110, a P-type low-concentration doping region 130 formed in an upper portion of the epitaxial layer 120 and a P-type high-concentration doping region 140 formed on the P-type low-concentration doping region 130, a P-type guard ring 150 formed in the upper portion of the epitaxial layer 120 to surround the P-type low-concentration doping region 130 and the P-type high-concentration doping region 140, a field oxide layer 160 formed on the P-type guard ring 150 and the P-type high-concentration doping region 140, an anode electrode 180 formed to overlap the P-type high-concentration doping region 140 and a portion of the field oxide layer 160, and a cathode electrode 190 formed below the substrate 110.

Additionally, the fast recovery diode 100 may further include a passivation layer 170 formed on the field oxide layer 160, and the anode electrode 180. Additionally, the fast recovery diode 100 may include a helium irradiation defect layer 302 formed in a drift layer 122.

Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The substrate 110 may be made of a high-concentration N-type (N+) substrate. The substrate 110 may be formed of a semiconductor substrate, such as a silicon substrate and a silicon carbide substrate.

The epitaxial layer 120 is formed on the substrate 110 and may include a buffer layer 121 and a drift layer 122 formed on the buffer layer 121. The buffer layer 121 and the drift layer 122 may have the same N conductivity type, with the drift layer 122 having a lower concentration than the buffer layer 121.

The P-type low-concentration doping region 130 may be formed within the epitaxial layer 120. For example, the P-type low-concentration doping region 130 may be formed in the drift layer 122 through the P-type ion implant and the first annealing process, with the annealing temperature performed between 900° C. and below 1300° C., and the process time may range from 100 minutes to less than 200 minutes.

The P-type low-concentration doping region 130 may be formed through the process of boron ion implantation.

The P-type high-concentration doping region 140 may be formed on the P-type low-concentration doping region 130. For example, the P-type high-concentration doping region 140 may be formed through the process of high-concentration P-type ion implantation and the second annealing process. The P-type high-concentration doping region 140 may establish an ohmic contact with the anode electrode 180. The P-type high-concentration doping region 140 may be formed through the process of ion implantation using boron ions containing fluorine (F), such as boron fluoride (BF2). The second annealing may be performed at a temperature between 700° C. and below 900° C., with a process time ranging from 20 minutes to less than 60 minutes.

Boron fluoride (BF2) is used to form the P-type high-concentration doping region 140 because the ion implantation process with boron fluoride (BF2) does not result in diffusion into the lower portion of the epitaxial layer 120 due to its heavier ion mass than conventional boron (B). This allows for the formation of a high-concentration region with a shallow depth.

The P-type high-concentration doping region 140 may be referred to as a contact formation process because it forms an ohmic contact with the anode electrode 180.

The concentration ratio between the P-type low-concentration doping region 130 and the P-type high-concentration doping region 140 after the first and second annealing processes may range from 1:10 to 1:100.

The P-type guard ring 150 is formed around the perimeter (outer edge) of the fast recovery diode 100 to alleviate electric field concentration under reverse bias and achieve a more stable breakdown voltage. The P-type guard ring 150 may be finally formed during the annealing process for the field oxide layer 160 after P-type ion implantation. Additionally, a bottom surface of the P-type guard ring may be formed deeper than a bottom surface of the P-type low-concentration doping region 130.

The field oxide layer 160 is formed on the epitaxial layer 120 via a thermal oxidation and etching process. The field oxide layer 160 may be formed on a portion of the P-type guard ring 150 and on the P-type high-concentration doping region 140.

The anode electrode 180 may be formed to overlap the P-type high-concentration doping region 140 and a portion of the field oxide layer 160. In addition, the P-type low-concentration doping region 130 may be formed to overlap the anode electrode 180.

The passivation layer 170 may be formed to cover a portion of the field oxide layer 160, the drift layer 122, and the anode electrode 180. The passivation layer 170 may be formed in contact with a portion of the top surfaces and sides of the field oxide layer 160 and the anode electrode 180.

The cathode electrode 190 may be formed below the substrate 110. For example, the cathode electrode 190 may be formed by grinding the bottom of the substrate 110, depositing a metal material on the bottom of the ground substrate 110, and then patterning the bottom of the substrate 110.

The fast recovery diode 100 according to an example of the present disclosure described above reduces the dose amount implanted to form a P-well region in order to reduce the number of hole carriers, thereby forming the P-type low-concentration doping region 130. Meanwhile, the P-type high-concentration doping region 140 is formed on the P-type low-concentration doping region 130 to compensate for ohmic contact with the anode electrode 180.

According to the present disclosure, as the number of hole carriers decreases, the absorbed dose (kGy) of the electron beam is reduced during the electron beam irradiation process, which is a process that shortens the carrier life time, thereby reducing the number of crystal defects occurring in the substrate 110 and the epitaxial layer 120. Also, by reducing the helium concentration in the helium irradiation process, the area of crystal defects in the epitaxial layer may be reduced, which may reduce the leakage current generated at high temperatures.

After the helium irradiation process, a helium irradiated defect layer 302 occurs within the drift layer 122. Furthermore, according to the present disclosure, the turn-on switching energy (Eon), reverse recovery time (Trr), and maximum reverse recovery current (Irr) of the fast recovery diode can be maintained similar to those of the conventional fast recovery diode without degradation.

Figure 2:
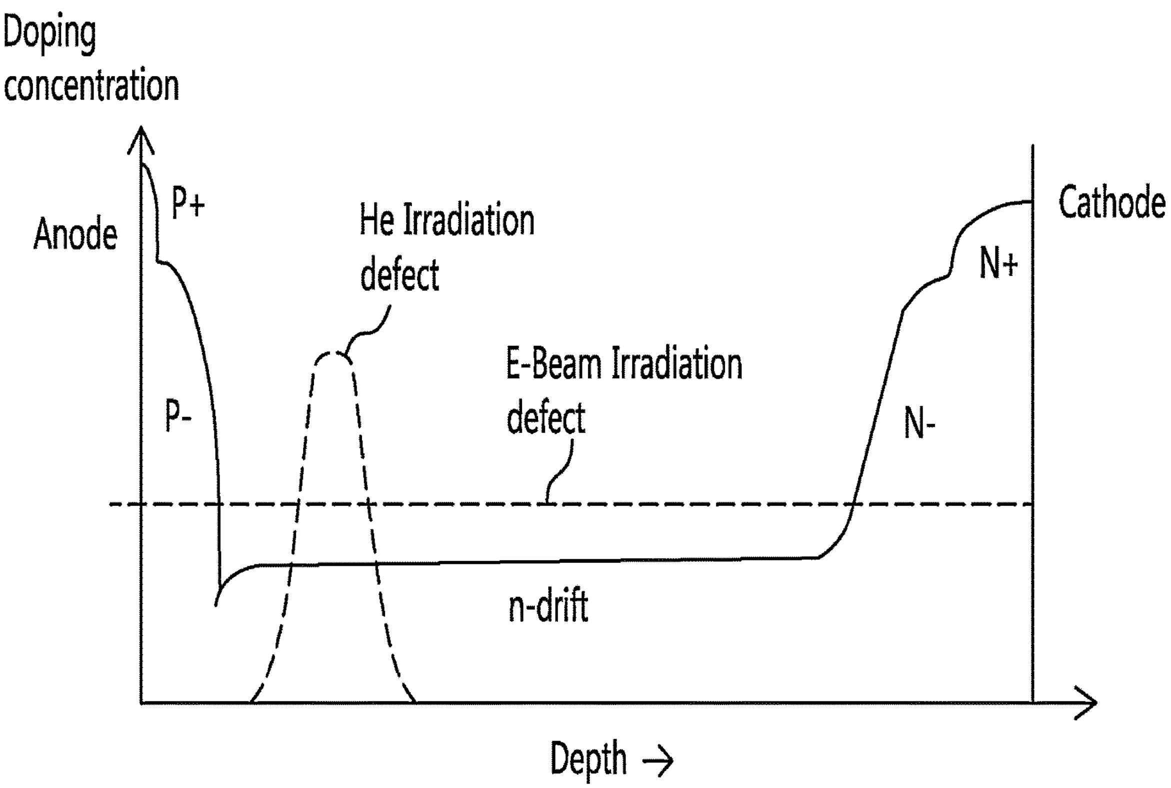
FIG. 2 illustrates a graph showing a change in doping concentration of a P-type region and an N-type region according to the depth from an anode to a cathode in a fast recovery diode according to an example of the present disclosure.
Figure 3A:
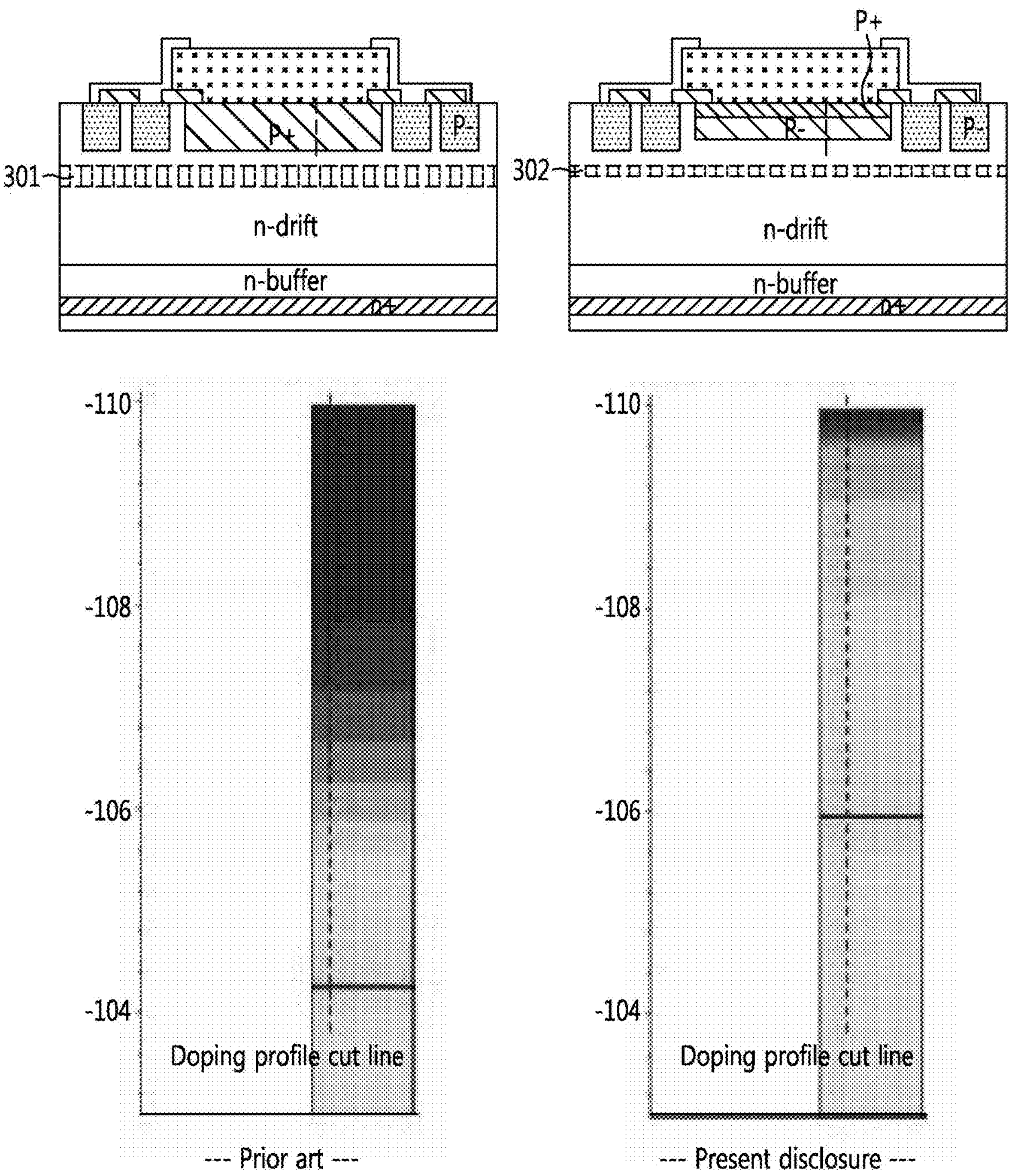
FIGS. 3A and 3B illustrate sectional views of comparison of fast recovery diode structures according to the prior art and an example of the present disclosure.
Figure 3B:
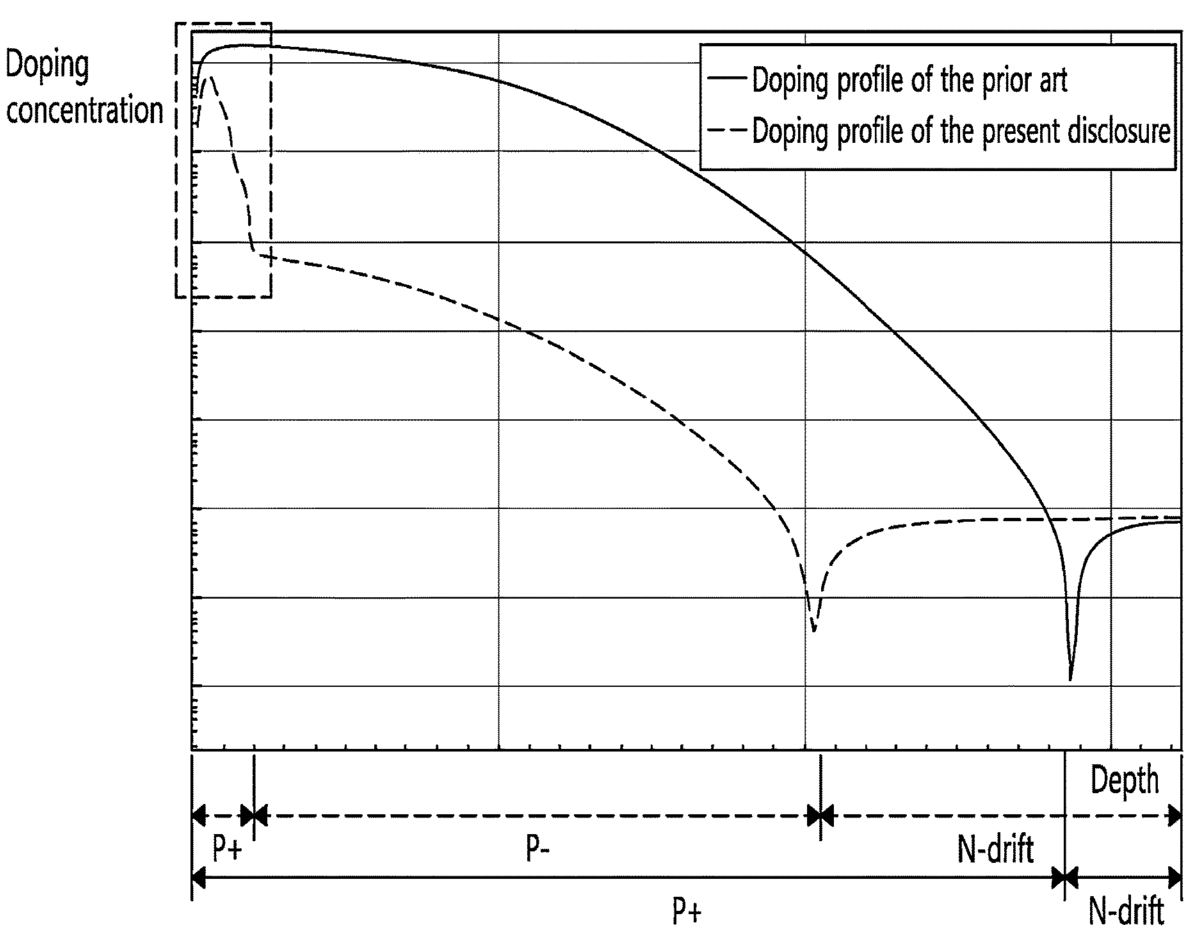
Figure 4A:
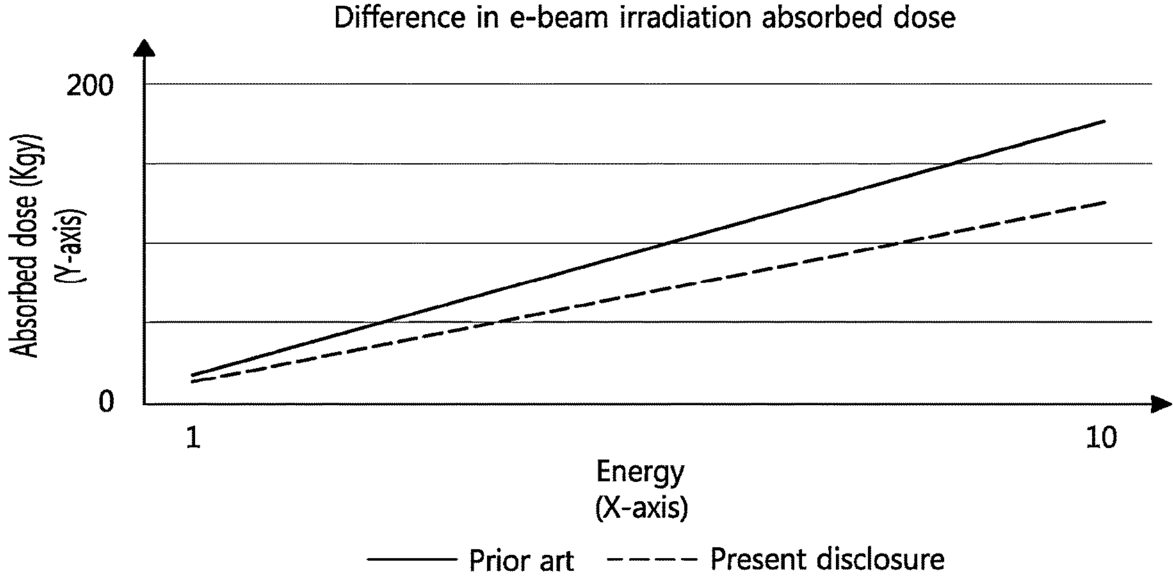
FIG. 4A illustrates a graph showing a comparison of absorbed doses implanted when performing electron beam irradiation according to the prior art and an example of the present disclosure.
Figure 4B:
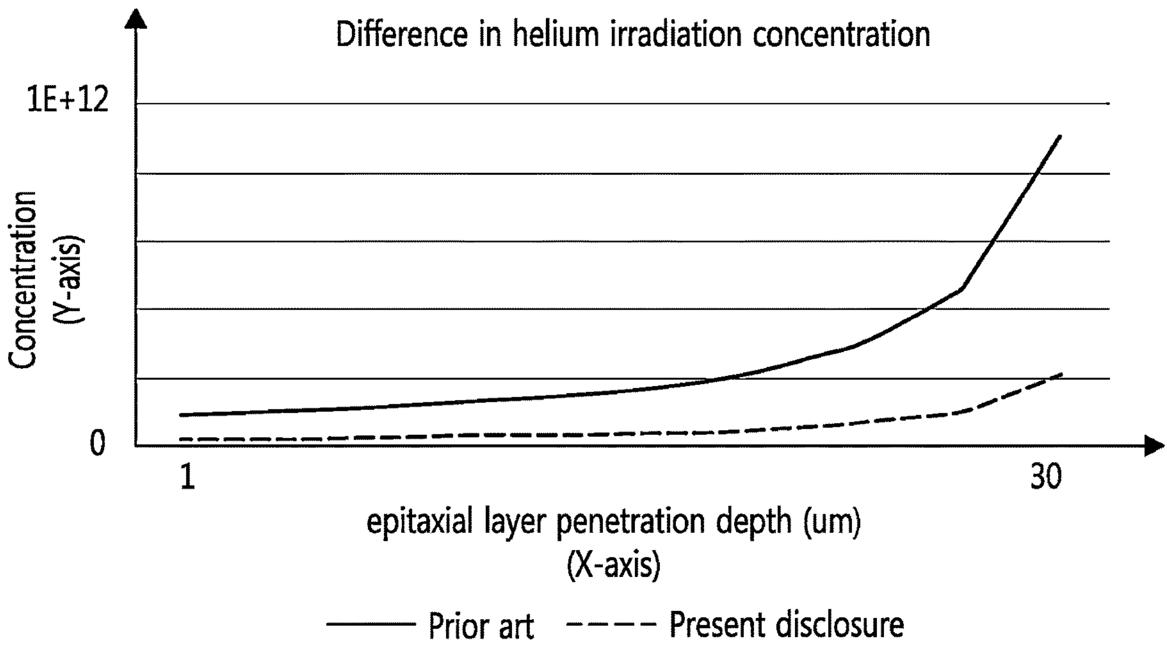
FIG. 4B illustrates a graph showing a comparison of helium concentrations implanted when performing helium irradiation according to the prior art and an example of the present disclosure.
Figure 5A:
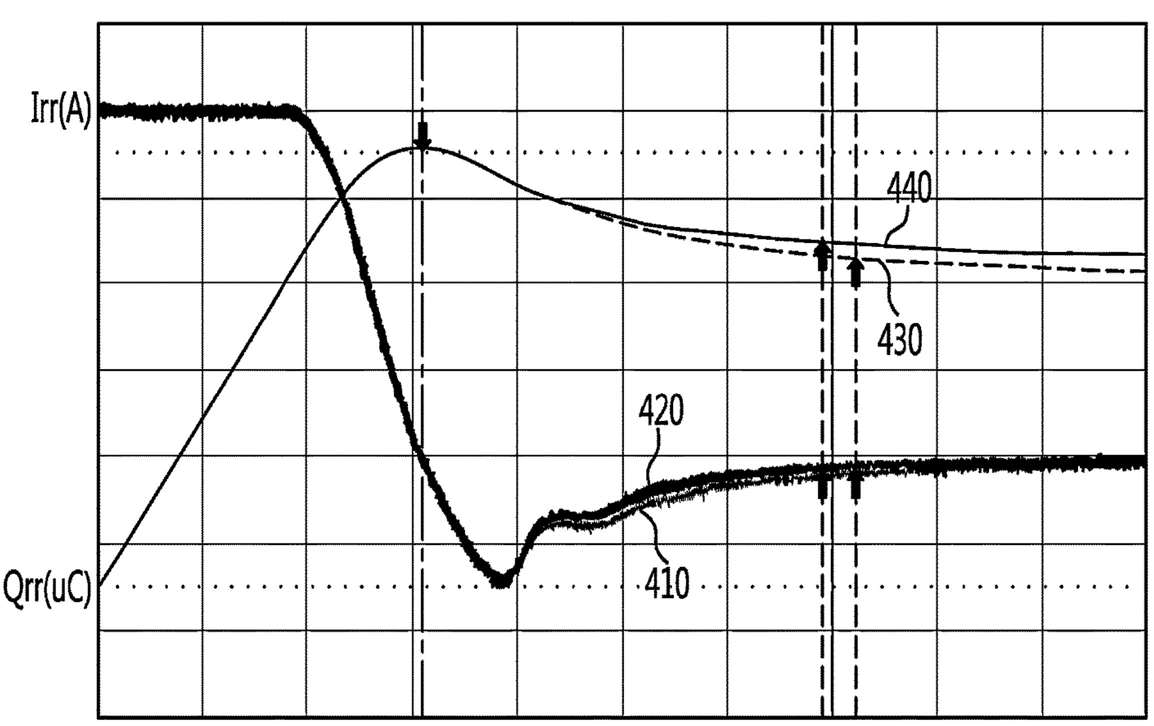
FIG. 5A illustrates a graph showing a comparison of characteristics of a fast recovery diode according to the prior art and an example of the present disclosure.
Figure 5B:
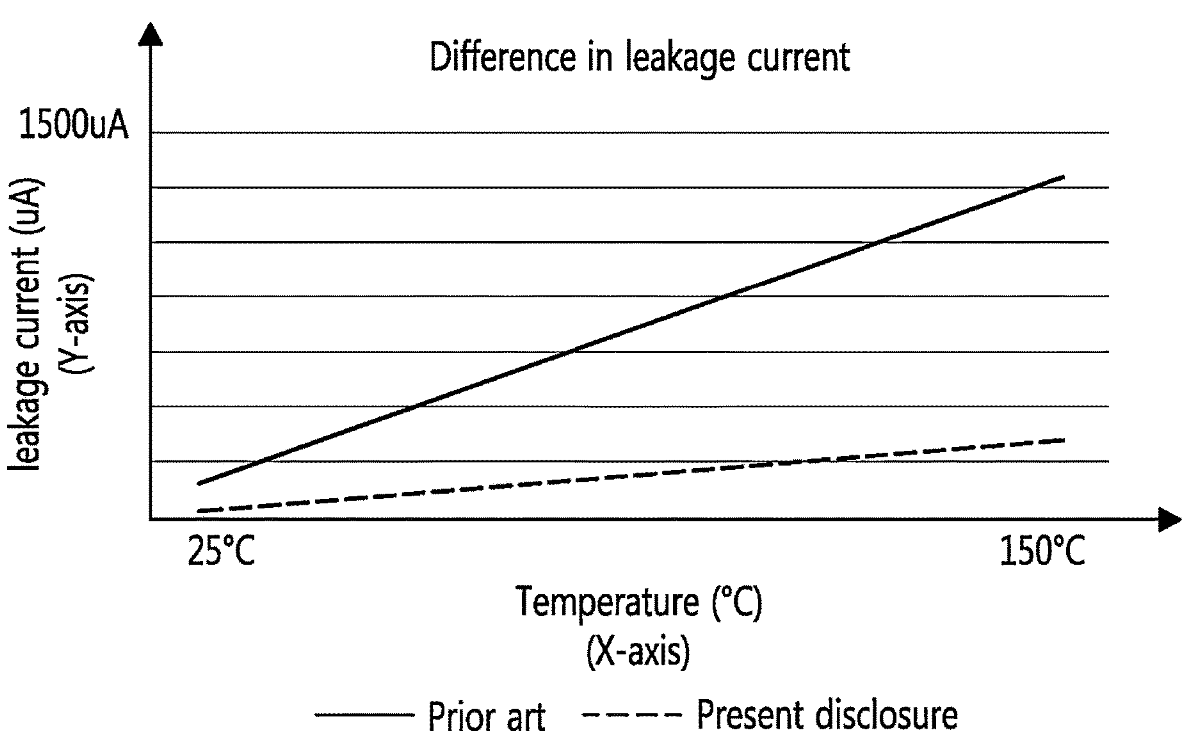
FIG. 5B illustrates a graph showing a comparison of leakage current according to the prior art and an example of the present disclosure.

FIG. 2 illustrates a graph showing a change in doping concentration of a P-type region and an N-type region according to the depth from an anode to a cathode in a fast recovery diode according to an example of the present disclosure. FIGS. 3A and 3B illustrate sectional views of comparison of fast recovery diode structures according to the prior art and examples of the present disclosure. FIG. 4A illustrates a graph showing a comparison of absorbed doses implanted when performing electron beam irradiation according to the prior art and an example of the present disclosure. FIG. 4B illustrates a graph showing a comparison of helium concentrations implanted when performing helium irradiation according to the prior art and an example of the present disclosure. FIG. 5A illustrates a graph showing a comparison of characteristics of a fast recovery diode according to the prior art and an example of the present disclosure. FIG. 5B illustrates a graph showing a comparison of leakage current according to the prior art and an example of the present disclosure.

Referring to FIG. 2, the doping concentration of a fast recovery diode according to one or more examples of the present disclosure may vary according to depth. For example, a concentration of the P-type high-concentration doping region (P+) and the P-type low-concentration doping region (P−) disposed on an anode electrode decreases in concentration gradually in the direction of the cathode electrode; the drift layer has a uniform concentration; and the buffer layer and substrate may increase in concentration gradually in the direction of the cathode electrode. Meanwhile, crystal defects may occur in the cathode region within the anode of the fast recovery diode due to electron beam irradiation, and crystal defects may occur in the drift layer due to helium irradiation.

However, according to the present disclosure, by controlling the absorbed dose of the electron beam irradiation and the helium irradiation concentration, the number of crystal defects occurring in the substrate and the epitaxial layer can be reduced.

Referring to FIGS. 3A and 3B, it may be seen that a thickness (depth) of the P-well (P+) region of the fast recovery diode according to the present disclosure becomes thinner in comparison to the fast recovery diode according to the prior art. This is because, unlike the conventional structure in which a P-type high-concentration doping region is formed in an epitaxial layer to simultaneously form the P-well (P+) region and ohmic contact, the present disclosure has a structure in which a P-type low-concentration doping region (P−) is formed and a P-type high-concentration doping region (P+) is additionally formed in the area that contacts the anode electrode. In other words, compared to the prior art, according to the present disclosure, the depth of the P-type high-concentration doping region is reduced, resulting in a thinner thickness (depth) of the P-well (P+) region. Additionally, the number of hole carriers may also be decreased.

The P-well (P+) region of the fast recovery diode according to the prior art is formed with a higher concentration of P-type doping than that of the P-well (P+) region of the fast recovery diode according to an example of the present disclosure.

The helium irradiation defect layer according to the prior art, labeled with reference numeral 301 of FIG. 3A, and the helium irradiation defect layer according to an example of the present disclosure, labeled with reference numeral 302, are shown to illustrate the reduced depth of the helium irradiation defect layer of the present disclosure compared to the prior art. This is a result of performing the process by reducing the helium irradiation concentration and the electron beam irradiation absorbed dose to shorten the life time of the hole carrier as the number of hole carriers decreases. Here, reference numerals 301 and 302 in FIG. 3A indicate a reduction in helium concentration and may differ from the actual configuration. The helium implant process is a process in which helium is implanted within about 15 to 30 um from the top surface of the epitaxial layer to create helium-induced crystal defects. As a result, helium may be present within the helium-irradiated defect layer.

The graph in FIG. 4A shows the difference in absorbed dose (kGy) of electron beam irradiation between the present disclosure and the prior art, and the graph in FIG. 4B shows the difference in helium irradiation concentration. Referring to FIGS. 4A and 4B, it can be seen that the absorbed dose of electron beam irradiation in the present disclosure is reduced by about 30% compared to the maximum value in the prior art, and the helium irradiation concentration is reduced by about 70% compared to the maximum value in the prior art.

Referring to FIG. 5A, it can be seen that the fast recovery diode according to an example of the present disclosure exhibits characteristics similar to prior art fast recovery diodes. For example, reference numeral 410 indicates a reverse recovery current value according to the present disclosure, and reference numeral 420 indicates a reverse recovery current value according to the prior art. Comparing reference numerals 410 and 420, it can be seen that the variation in reverse recovery current (Irr) is similar between the two numerals. Reference numeral 430 indicates a reverse recovery charge value according to the present disclosure, and reference numeral 440 indicates a reverse recovery charge value according to the prior art. Comparing reference numerals 430 and 440, it can be seen that the variation in reverse recovery charge (Qrr) is similar.

The reverse recovery charge (Qrr) represents the amount of charge required to dissipate the reverse recovery current in the internal diode.

The present disclosure may maintain characteristics of turn-on switching energy (Eon), reverse recovery time (Trr), reverse recovery charge (Qrr), and maximum reverse recovery current (Irr) similar to the prior art. In addition, the present disclosure may reduce leakage current at high temperatures due to a reduction in the number of defects compared to the prior art. For example, when the fast recovery diode according to the present disclosure is operated during switching of a power device such as an insulated gate bipolar transistor (IGBT) device, the leakage current generated during operation is 4~5 times lower than the prior art. For example, referring to the graph of FIG. 5B, which shows the leakage current of the prior art and the present disclosure when operating within a temperature range of 25° C. to 150° C., it can be seen that the leakage current in the present disclosure is significantly reduced by up to 4~5 times compared to the prior art.

Figure 6:
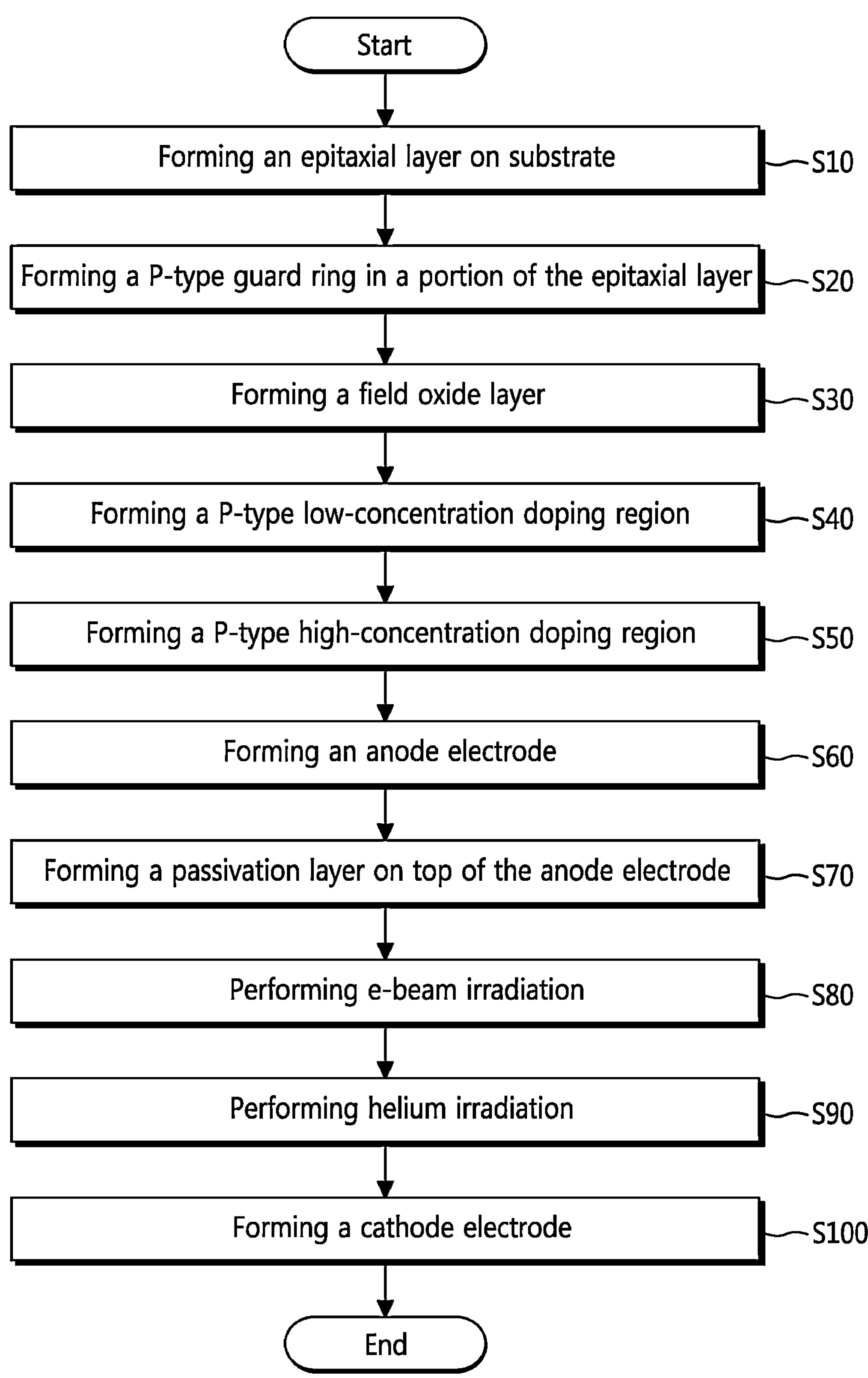
FIG. 6 illustrates a flowchart showing a method for manufacturing a fast recovery diode according to an example of the present disclosure.

FIG. 6 illustrates a flowchart showing a method for manufacturing a fast recovery diode according to an example of the present disclosure.

Referring to FIG. 6, a method of manufacturing a fast recovery diode according to an example of the present disclosure includes: forming an epitaxial layer on a substrate (S10), forming a P-type guard ring by implanting P-type ions into a portion of the epitaxial layer (S20), forming a field oxide layer on the P-type guard ring (S30), forming a P-type low-concentration doping region in the epitaxial layer (S40), forming a P-type high-concentration doping region on the P-type low-concentration doping region (S50), forming an anode electrode to overlap the P-type high-concentration doping region and a portion of the field oxide layer (S60), forming a passivation layer to cover a portion of top surfaces of the field oxide layer and the anode electrode (S70), irradiating an electron beam (S80), irradiating helium (S90), and forming a cathode electrode below the substrate (S100).

The formation of the epitaxial layer (S10) may include forming a buffer layer on the substrate and forming a drift layer on the buffer layer. The substrate may be a high-concentration N-type (N+) substrate, and the buffer layer and the drift layer may be low-concentration N-type (N−) buffer and drift layers.

The formation of the field oxide layer on the P-type guard ring (S30) includes forming an oxide layer on a top surface of the epitaxial layer via a thermal oxidation process, and patterning the oxide layer to expose a portion of the top surface of the guard ring.

The formation of the P-type low-concentration doping region (S40) may include forming the P-type low-concentration doping region through P-type ion implantation and annealing. In detail, after forming a mask on the field oxide layer, the remaining area excluding the portion for forming the P-type low-concentration doping region is patterned, and then a low-concentration P-type ion implantation process is performed. In this way, the present disclosure may reduce the number of hole carriers by forming a low concentration of P-type region.

The formation of the P-type high-concentration doping region (S50) may include forming the P-type high-concentration doping region through the P-type high-concentration ion implantation and annealing. In this way, the present disclosure may prevent the resistance from increasing by forming a P-type high-concentration doping region between the anode electrode and the P-type low-concentration doping region.

The formation of the passivation layer on top of the anode electrode (S70) may further include forming the passivation layer on the field oxide layer. In this case, the passivation layer may be formed in contact with the top and sides of the field oxide layer and the anode electrode.

The performing of the electron beam irradiation and the helium irradiation (S80 and S90) may be a process of reducing the lifetime of hole carriers for fast-switching operation. In step S80, the electron beam may irradiate the entire area of the fast recovery diode. In step S90, the helium irradiation process may be performed near the drift layer of the fast recovery diode.

Meanwhile, by reducing the number of hole carriers in step S40, the present disclosure results in a reduction of the electron beam irradiation absorbed dose and the helium irradiation concentration in steps S80 and S90. Therefore, the present disclosure may reduce crystal defects generated in the substrate and the epitaxial layer by electron beam irradiation and helium irradiation, and may induce a reduction in leakage current at high temperatures as the defects are reduced. As a result, the present disclosure may obtain a reliable range (e.g., temperature range) compared to the prior art.

The concentration ratio during the ion implantation process of the P-type low-concentration doping region and the P-type high-concentration doping region is typically formed in a ratio of 1:2 to 1:20, and the concentration ratio may vary in value depending on diffusion through annealing and subsequent processes.

A fast recovery diode according to one or more examples of the present disclosure may reduce the number of crystal defects that occur in the substrate and epitaxial layer by reducing the electron beam irradiation absorbed dose and helium irradiation concentration. In addition, the fast recovery diode may reduce leakage current at high temperatures while maintaining characteristics such as turn-on switching energy, reverse recovery time (Trr), and maximum reverse recovery current.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A fast recovery diode, comprising:

a substrate;

an epitaxial layer formed on the substrate;

a P-type low-concentration doping region formed in an upper portion of the epitaxial layer and a P-type high-concentration doping region formed on the P-type low-concentration doping region;

a P-type guard ring formed in the upper portion of the epitaxial layer to surround the P-type low-concentration doping region and the P-type high-concentration doping region;

a field oxide layer formed on the P-type guard ring and the P-type high-concentration doping region;

an anode electrode formed to overlap the P-type high-concentration doping region and a portion of the field oxide layer; and a cathode electrode formed below the substrate.

2. The fast recovery diode of claim 1, wherein the substrate is a high-concentration N-type (N+) substrate.

3. The fast recovery diode of claim 1, wherein the epitaxial layer comprises:

an N-type low-concentration buffer layer; and an N-type low-concentration drift layer formed on the N-type low-concentration buffer layer.

4. The fast recovery diode of claim 1, further comprising a passivation layer formed on top the anode electrode.

5. The fast recovery diode of claim 1, wherein a bottom surface of the P-type low-concentration doping region is located lower than a bottom surface of the P-type guard ring relative to a top surface of the epitaxial layer.

6. The fast recovery diode of claim 1, wherein a bottom surface of the field oxide layer is in contact with the P-type guard ring, the epitaxial layer, and the P-type high-concentration doping region.

7. The fast recovery diode of claim 6, wherein the field oxide layer overlaps the P-type low-concentration doping region.

8. The fast recovery diode of claim 1, wherein the P-type high-concentration doping region is in ohmic contact with the anode electrode.

9. The fast recovery diode of claim 1, wherein a concentration ratio between the P-type low-concentration doping region and the P-type high-concentration doping region ranges from 1:10 to 1:100.

10. The fast recovery diode of claim 1, further comprising a helium irradiation defect layer formed in the epitaxial layer, wherein the helium irradiation defect layer is disposed below the P-type low-concentration doping region, and wherein the helium irradiation defect layer is located between 15 um and 30 um beneath a top surface of the epitaxial layer.

11. The fast recovery diode of claim 10, wherein the helium irradiation defect layer comprises helium inside.

* * * * *